United States Patent [19]
Krautschneider et al.

[11] Patent Number: 6,049,105
[45] Date of Patent: Apr. 11, 2000

[54] DRAM CELL ARRANGEMENT HAVING DYNAMIC SELF-AMPLIFYING MEMORY CELLS, AND METHOD FOR MANUFACTURING SAME

[75] Inventors: Wolfgang Krautschneider, Hohenthann; Franz Hofmann, Munich, both of Germany

[73] Assignee: Siemens Aktiengesellschaft, Munich, Germany

[21] Appl. No.: 09/089,539

[22] Filed: Jun. 3, 1998

[30] Foreign Application Priority Data

Jun. 27, 1997 [DE] Germany .......................... 197 27 436

[51] Int. Cl.[7] .................................................. H01L 29/76
[52] U.S. Cl. ........................ 257/329; 257/330; 257/331
[58] Field of Search .................................. 257/329, 330, 257/331, 332, 393, 296

[56] References Cited

U.S. PATENT DOCUMENTS 5,308,778   5/1994   Fitch et al. .

FOREIGN PATENT DOCUMENTS

WO 92/01287   1/1992   WIPO .

OTHER PUBLICATIONS

"A Surrounding Gate Transistor (SGT) Gain Cell for Ultra High Density DRAMs" M. Terauchi et al., pp. 21–22.

IEEE Transactions of Electron Devices, vol. 41, No. 6, Jun. 1994.

Primary Examiner—Sara Crane
Attorney, Agent, or Firm—Hill & Simpson

[57] ABSTRACT

A DRAM cell arrangement having dynamic, self-amplifying memory cells, and method for manufacturing same, wherein each memory cell includes a selection transistor, a memory transistor and a diode structure. The selection transistor and the memory transistor are each fashioned as vertical MOS transistors and are arranged one over the other such that they are connected to one another via a common source/drain region. A source/drain region of the memory transistor is connected to a supply voltage line, a source/drain region of the selection transistor is connected to a bitline, and the gate electrode of the selection transistor is connected to a wordline. A diode structure is connected between the common source/drain region and the gate electrode of the memory transistor.

7 Claims, 6 Drawing Sheets

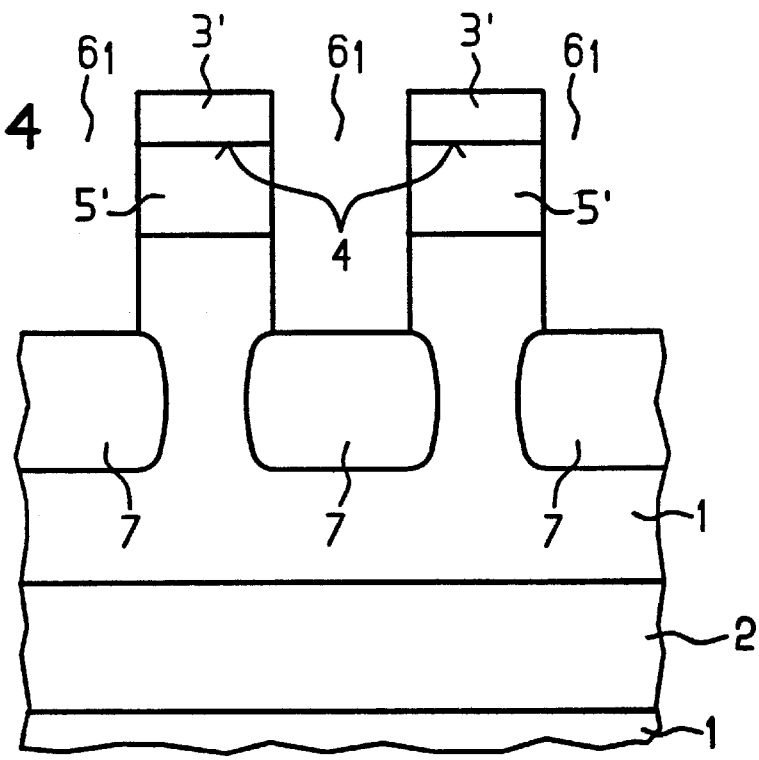
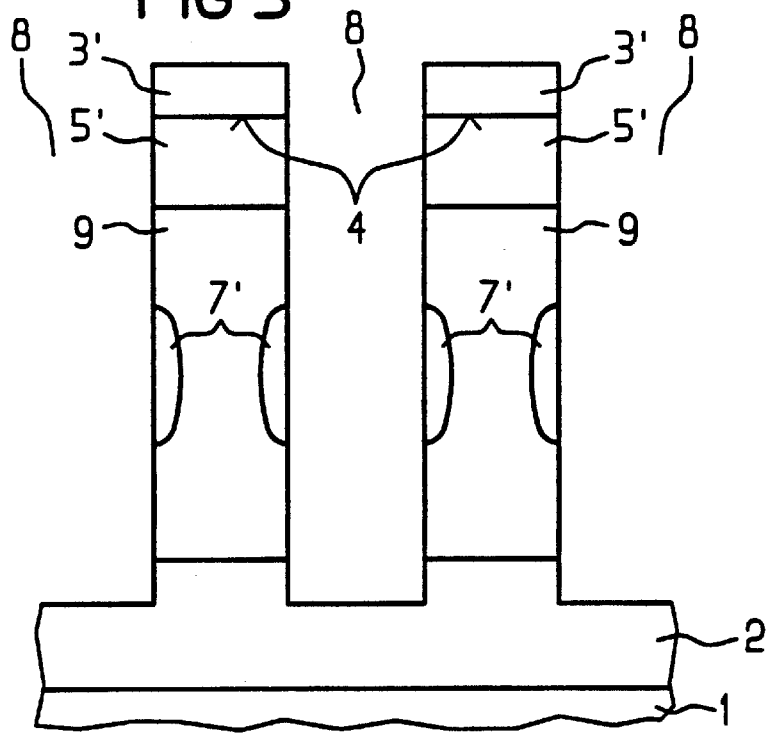

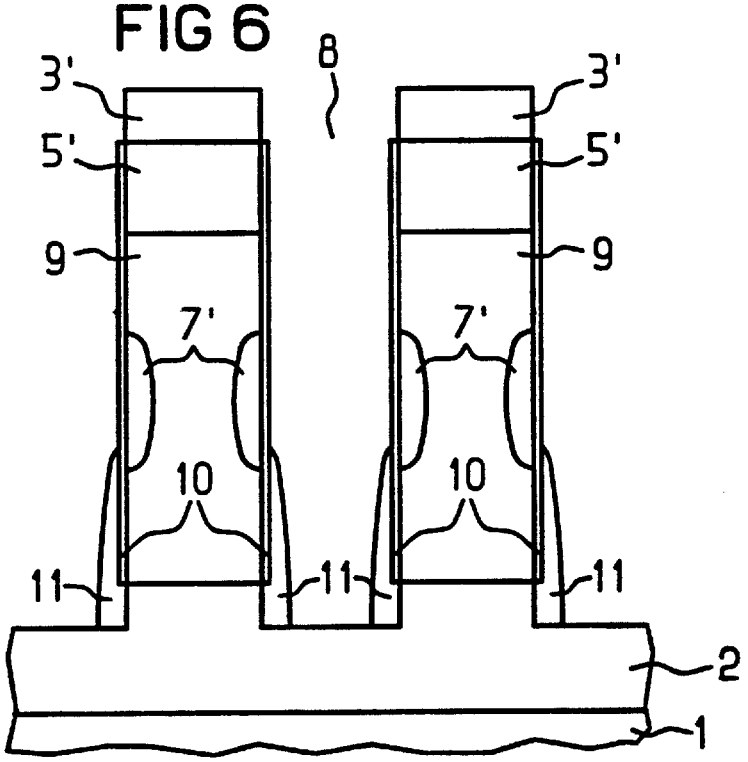
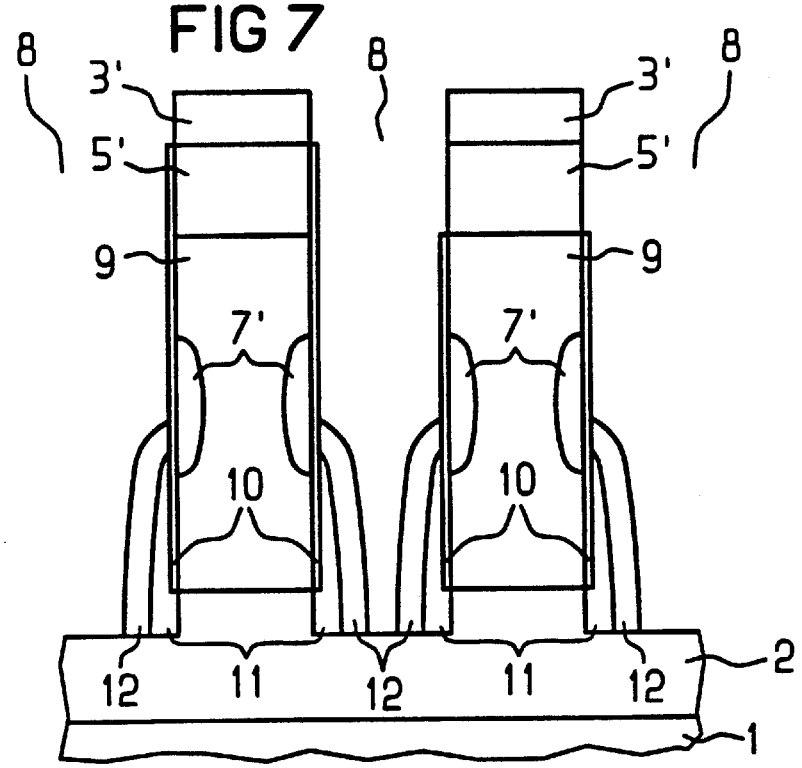

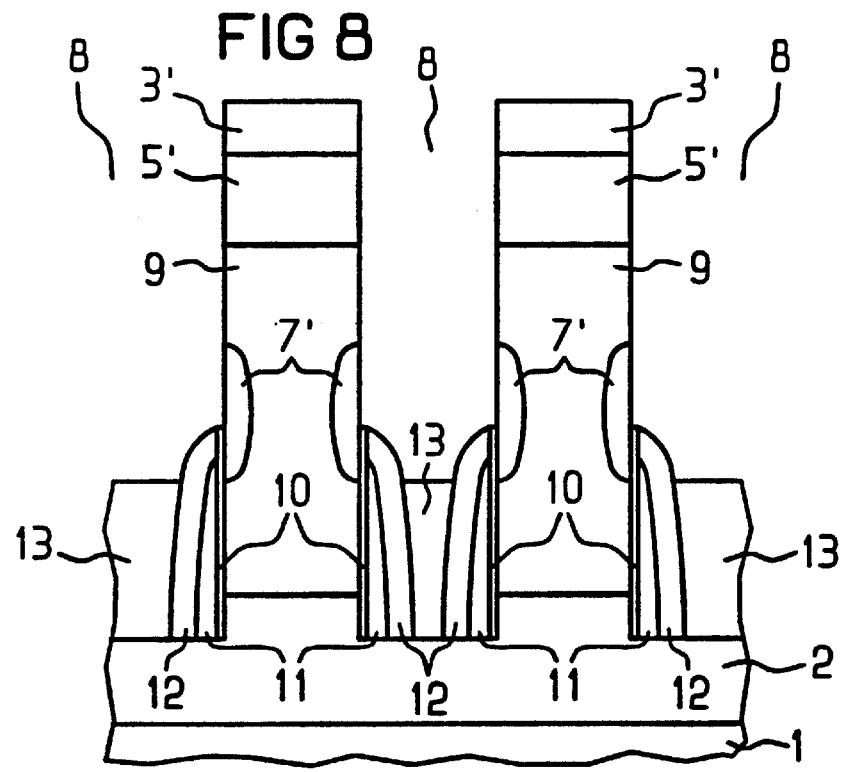
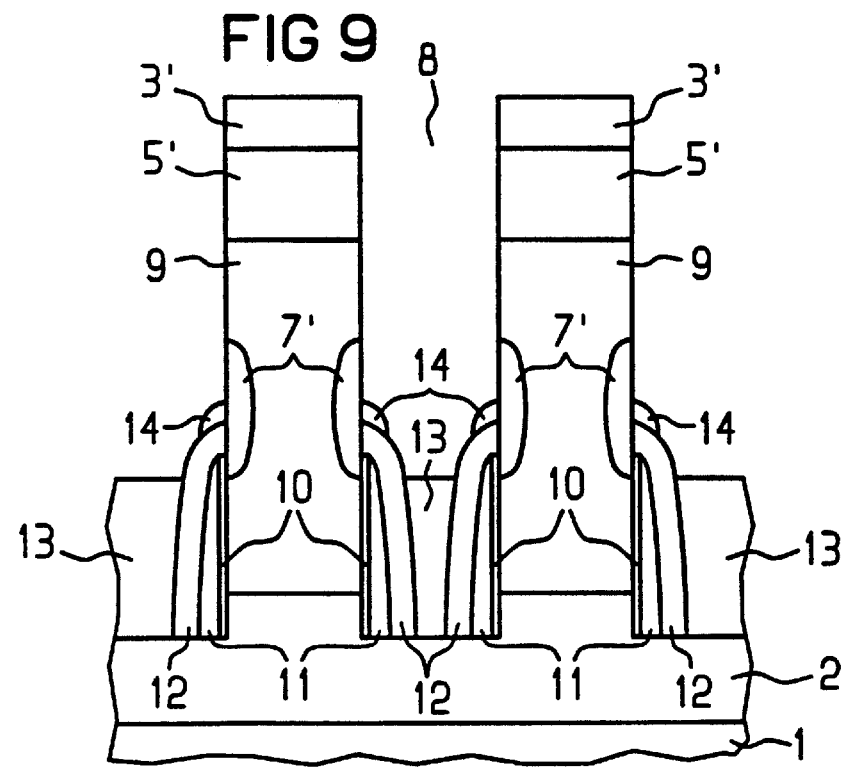

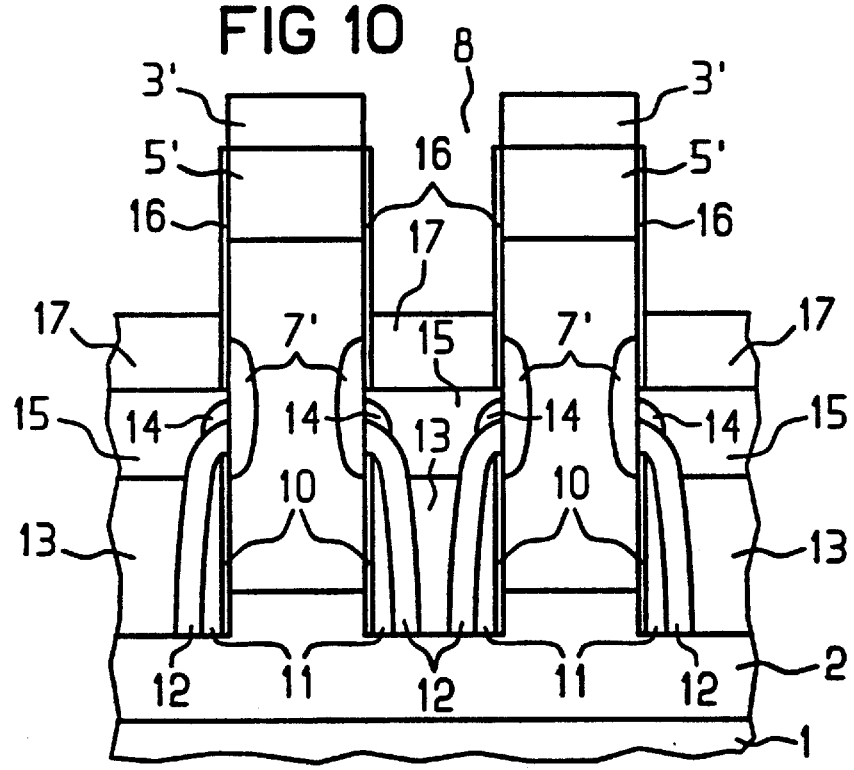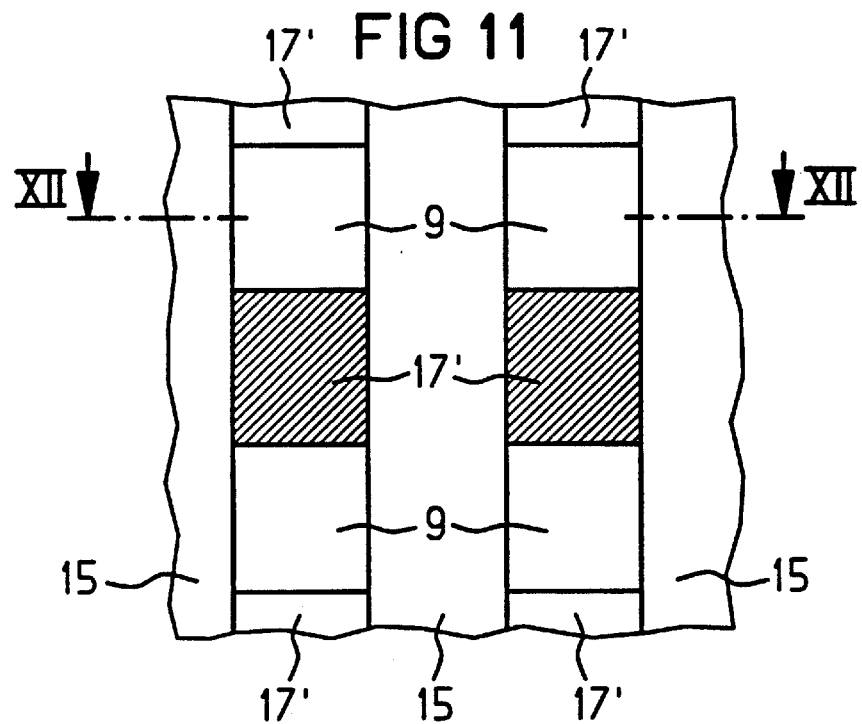

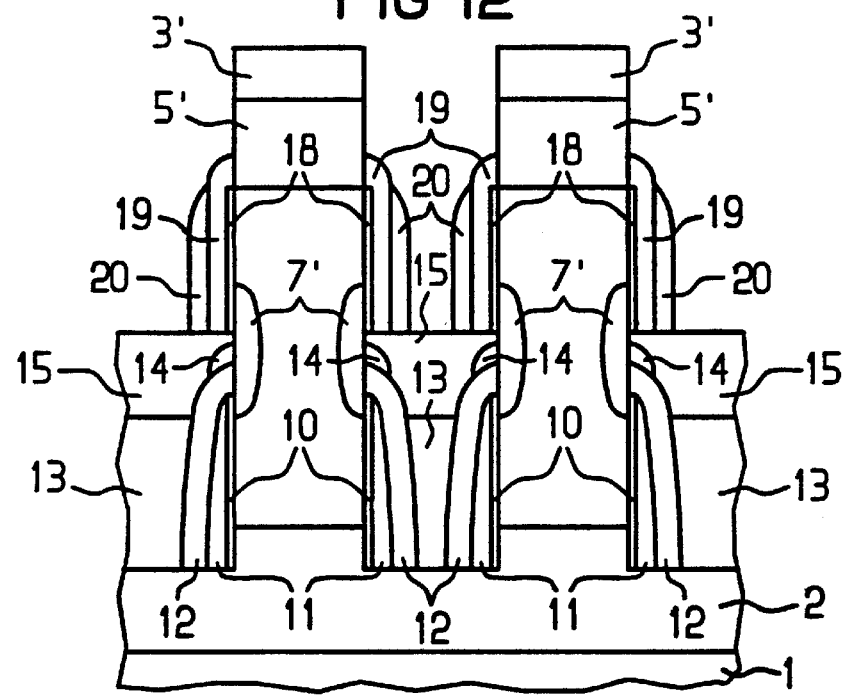
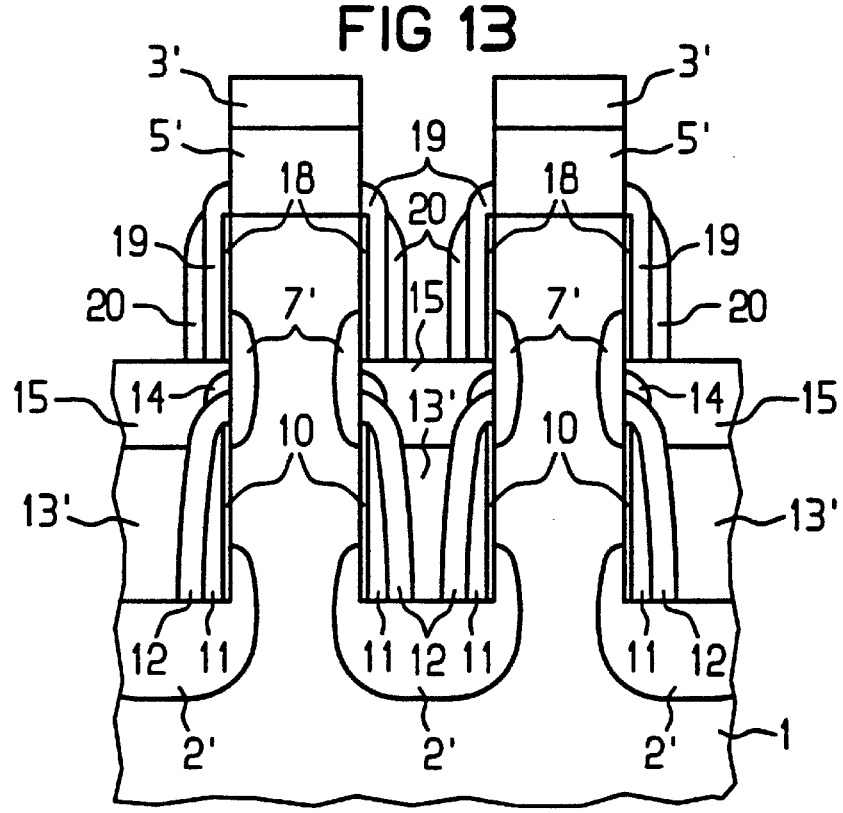

DRAM CELL ARRANGEMENT HAVING DYNAMIC SELF-AMPLIFYING MEMORY CELLS, AND METHOD FOR MANUFACTURING SAME

BACKGROUND OF THE INVENTION

1. Field of the Invention

The present invention relates to a DRAM cell arrangement, and method for manufacturing same, having an increased packing density by constructing the selection transistor and the memory transistor of the self-amplifying memory cells as MOS transistors that are vertical in relation to a main surface of a substrate wherein the selection transistor and the memory transistor are arranged one over the other and are connected via a common source/drain region.

2. Description of the Prior Art

With increasing storage density per chip from one memory generation to the next, the surface of dynamic semiconductor memory cells has constantly been made smaller. For this purpose, beginning with the 4 Mbit memory generation, three-dimensional structures are required. Beginning with the 64 Mbit memory generation, the memory capacity has reached a value that can hardly be reduced any further, so that an approximately constant capacity has to be realized on a reduced cell surface. This leads to a considerable technological expense.

In contrast, in memory cells in which the signal charge is supplied not by a memory capacitor but rather by a supply voltage source, the level of the signal charge is not determined by the size of the memory capacity. In these memory cells, it is sufficient to store only a smaller charge in the storage capacitor which, when the memory cell is read out, activates a switching element in such a way that a conductive connection is produced between the supply voltage source and a bit line. Memory cells of this sort are designated self-amplifying memory cells, or gain memory cells.

A self-amplifying memory cell of this sort was, for example, proposed in M. Terauchi, A. Nitayama, F. Horiguchi and F. Masuoka, "A surrounding gate transistor (SGT) gain cell for ultra high density DRAMs," VLSI-Symp. Dig. Techn. Pap., p. 21, 1993. It includes an MOS transistor that surrounds a silicon column and, arranged thereunder, a junction field effect transistor. The MOS transistor works as a write transistor, while the junction field-effect transistor works as a readout transistor. For reading and writing information, two separate wordlines are required in this memory cell, so that two wordlines are provided for each memory cell.

In S. Shukuri, T. Kure, T. Kobayashi, Y. Gotoh and T. Nishida, "A semistatic complementary gain cell technology for sub-1 V supply DRAMs," IEEE Trans. Electron. Dev., vol. 41, p. 926, 1994, a self-amplifying memory cell was proposed that comprises a planar MOS transistor and a thin-film transistor that is complementary thereto and which is arranged in a trench. The planar MOS transistor serves for the writing of items of information and the thin-film transistor serves to read out items of information. The thin-film transistor includes a floating gate that is charged with a charge when items of information are written in. The gate electrodes of the two MOS transistors are connected with a wordline. They are driven with differing polarity, so that the production and switching of wordline voltages means an outlay in terms of circuitry.

From WO 92/01287, a self-amplifying dynamic MOS transistor memory cell is known that includes a selection transistor and a memory transistor. In this memory cell, the charge is stored in the gate/source capacitor of the memory transistor. The two transistors are connected in series, and include a common drain/source region. This common drain/source region is connected with the gate electrode of the memory transistor via a diode structure. During readout, the memory transistor is activated according to the stored information wherein it then closes a current path from a supply voltage to a bit line. In this cell type, selection and memory transistors are connected in series so that no specific line is required to read out the signal. The selection transistor and the memory transistor can thereby perform both as planar MOS transistors and as vertical MOS transistors, respectively arranged along the edge of a trench.

SUMMARY OF THE INVENTION

The present invention is directed toward the problem of indicating a DRAM cell arrangement with dynamic self-amplifying memory cells, as well as a method for manufacturing the same, which can be manufactured with a high packing density and improved electrical characteristics.

Accordingly, in a preferred embodiment of the present invention, the DRAM cell arrangement has a packing density which is increased by constructing the selection transistor and the memory transistor of the self-amplifying memory cells as MOS transistors that are vertical in relation to a main surface of a substrate. The selection transistor and the memory transistor are therein arranged one over the other and are connected with one another via a common source/drain region. In comparison with known cell arrangements, the packing density of the above-described DRAM cell arrangement may be increased by a factor of 2.

The vertical MOS transistors can be arranged both on the edge of a trench and on the edges of raised structures; e.g., columns. A source/drain region of the memory transistor is connected with a supply voltage line. A source/drain region of the selection transistor is connected with a bit line. The gate electrode of the selection transistor is connected with a wordline. A diode structure is connected between the common source/drain region and the gate electrode of the memory transistor.

The substrate preferably includes columns that are arranged perpendicular to the main surface of the substrate. The selection transistor and the memory transistor of a memory cell are arranged on the edges of one of the columns, wherein the gate electrodes of the selection transistor and of the memory transistor, as well as the diode structure, annularly surround the column. Since the gate electrodes annularly surround the columns, the channel runs over the annular surface of the column. In comparison to a planar MOS transistor which is manufactured with the same structural fineness as the columns, the selection transistor and the memory transistor of the preferred embodiment of the present invention comprise a channel width that is larger by a factor of 4. As such, both a higher packing density and a higher current carrying capacity of the selection and memory transistors is achieved. As a result of this increased current carrying capacity, when the memory cells are read out, a higher signal can be picked off at the bit line, based on the connection of the source/drain region of the memory transistor with the supply voltage line.

The supply voltage line preferably runs at least partially in the substrate underneath the columns. The voltage supply line can thereby be fashioned as a continuous plate for all the memory cells in common, as a grid-type plate or as a multiplicity of strip-type lines that run in parallel. The construction of the supply voltage line as a continuous plate has the advantage in that it can be manufactured easily. The construction of the supply voltage line as a grid-type plate has the advantage in that the material of the column can be charged with the substrate potential or with the potential of a doped tub that is adjacent to the columns. In this way, floating-body effects are avoided. The construction of the supply voltage line in the form of discrete lines that run in parallel has the advantage in that the memory cells can be evaluated via these discrete supply voltage lines.

It is within the scope of the present invention to construct the diode structure as an np diode and/or as a Schottky diode. A further possibility is to manufacture this diode structure as a thin-layer diode in the form of a thin-film component having a dielectric film of about 1 to 2 nm thickness in order to enable direct tunneling. This dielectric film is located between two differently doped semiconducting layers made of, for example, polycrystalline silicon. Preferably, an additional conductive structure is arranged between the diode structures of adjacent columns. Such additional conductive structure forms an additional capacitor together with the surface of the diode structure adjacent thereto. Further, the memory cell arrangement is preferably manufactured using self-adjusting procedural steps. For the formation of the columns, first and second trenches are first etched wherein both the first trenches and the second trenches are strip-shaped. The first and second trenches run essentially parallel to one another, yet the first trenches cross the second trenches. In this way, the columns can be manufactured both with an edge length of the minimum structural size F that can be manufactured in the respective technology and with a spacing of a minimum manufacturable structural size F. As a result, a space requirement per memory cell of $4F^2$ can be achieved.

Preferably, for the formation of the columns, first and second partial trenches are first etched wherein they have runs corresponding to those of the first and second trenches and have depths which are less than those of the first and second trenches. Subsequently, a doped region is formed on the floor of the first and second partial trenches. Through further etching, the first and second trenches are produced from the first and second partial trenches. By structuring the doped region on the floor of the first and second partial trenches, the common source/drain region is thereby produced. The common source/drain region is arranged in annular fashion on the edge of the respective column. The doped region can be formed both by implantation and by means of diffusion out from a source of doping material; e.g., from doped glass.

If the supply voltage line is formed as a continuous plate, it can be produced before the formation of the columns. If it is formed as a grid-type plate, the supply voltage line is produced as a doped region on the floor of the first and second trenches after the formation of the columns.

For the formation of discrete supply voltage lines, it is within the scope of the present invention first to etch the first trenches, and to produce the supply voltage lines on the floor thereof by means of implantation or diffusion. After this, the second trenches are opened transversely thereto. Subsequently, the first trenches and the second trenches are filled with insulating material. The insulating material thereby reaches approximately to the height at which the common source/drain regions are arranged. Through diffusion out from a source of doping material (e.g., from doped glass), the common source/drain regions are subsequently formed which annularly surround the columns.

The gate electrodes of both the memory transistor and the selection transistor, as well as the diode structure, are preferably fashioned using spacer techniques by applying corresponding layers and by anisotropic back-etching of these layers. In this way, the structures can have dimensions that are smaller than the minimum manufacturable structural size F in the respective technology.

It is within the scope of the present invention that the substrate include monocrystalline silicon, at least in the region of the main surface. A monocrystalline silicon disk or a monocrystalline silicon layer that is part of a substrate including, on a carrier disk, an insulating layer, and on it the monocrystalline silicon layer, is particularly suitable as a substrate. Furthermore, it is within the scope of the present invention that the substrate include SiC in the region of the main surface. Lastly, the diode structure is preferably produced using differently doped silicon layers and/or metal silicide.

Additional features and advantages of the present invention are described in, and will be apparent from, the Detailed Description of the Preferred Embodiments and from the Drawings.

DESCRIPTION OF THE DRAWINGS

FIG. 4 shows the section through the substrate of FIG. 2 after the formation of a doped region.

FIG. 5 shows the section through the substrate of FIG. 4 after the formation of first and second trenches for the completion of the columns.

FIG. 6 shows the section through the substrate of FIG. 5 after the formation of a gate dielectric and first doped polysilicon spacers.

FIG. 7 shows the section through the substrate of FIG. 6 after the formation of a diffusion barrier and second doped polysilicon spacers.

FIG. 8 shows the section through the substrate of FIG. 7 after the formation of a first intermediate oxide layer.

FIG. 9 shows the section through the substrate of FIG. 8 after the formation of conductive structures that are arranged on the surface of the second doped polysilicon spacers.

FIG. 10 shows the section through the substrate of FIG. 9 after the formation of a second intermediate oxide layer and of a conductive layer.

FIG. 11 shows a top view of the substrate of FIG. 10 after the structuring of the conductive layer for the formation of wordline segments.

FIG. 12 shows the section indicated in FIG. 11 of the substrate after the formation of third doped polysilicon spacers.

FIG. 13 shows a section through the substrate of FIG. 12 in which a grid-type supply voltage line was formed.

DETAILED DESCRIPTION OF THE PREFERRED EMBODIMENTS

Figure 1:
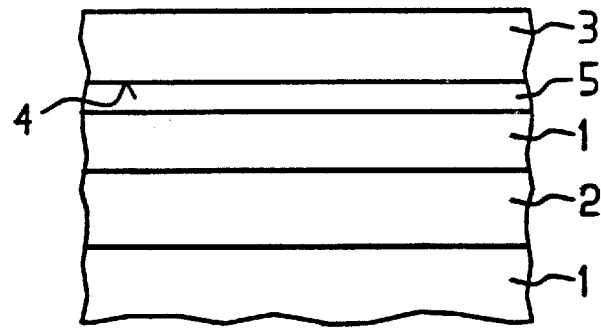
FIG. 1 shows a section through a p-doped substrate of the present invention with a buried $n^+$-doped layer and an $SiO_2$ layer.

In a substrate 1 of p-doped monocrystalline silicon with a basic doping of approximately $10^{16}$ cm$^{-3}$, a buried $n^+$-doped layer 2 with a depth of approximately 1 $\mu$m and a thickness of approximately 0.2 $\mu$m, is produced by means of implantation with arsenic, with a dose of approximately $10^{14}$ cm$^{-2}$ and an energy of approximately 2 MeV (see FIG. 1). Alternatively, an n$^+$-doped silicon substrate on whose surface a p-doped epitaxial layer has been produced can be used as the substrate 1.

Figure 2:
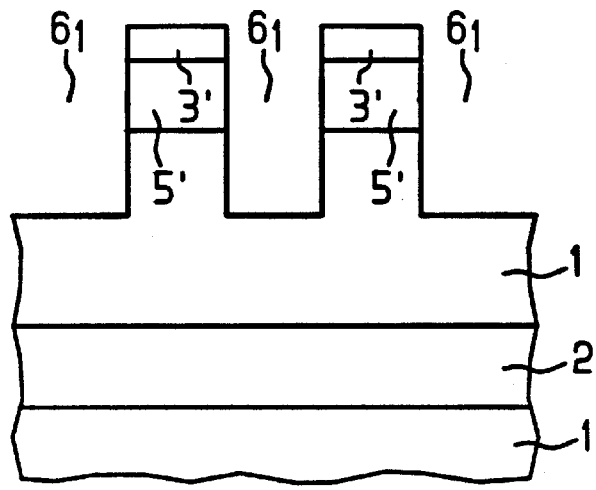
FIG. 2 shows the section through the substrate of FIG. 1 after the formation of a hard mask from the $SiO_2$ layer and the formation of columns.
Figure 3:
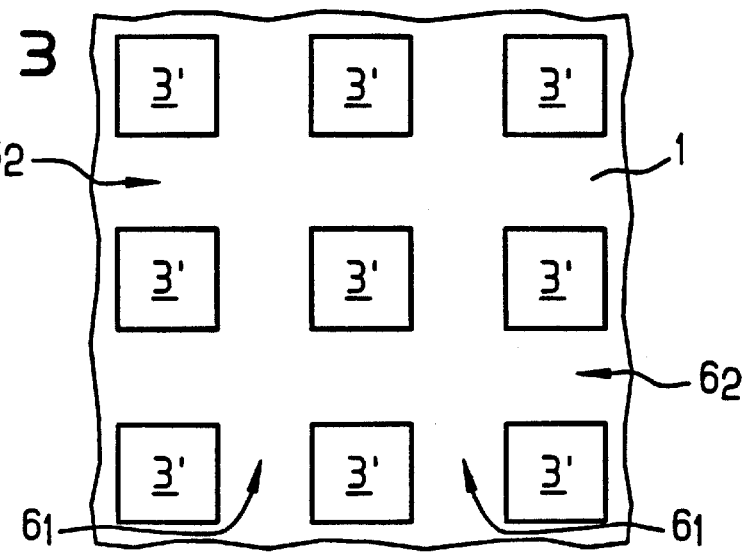
FIG. 3 shows a top view of the substrate shown in FIG. 2.

Bordering on a main surface 4, an n$^+$-doped layer 5 is produced with a thickness of approximately 0.1 μm, by means of implantation with arsenic with a dose of $2\times10^{15}$ cm$^{-2}$ and an energy of 200 keV. Subsequently, on the main surface 4 of the substrate 1 an SiO$_2$ layer 4 is deposited, for example, in a TEOS method with a layer thickness of approximately 200 nm. Using photolithographic process steps, a hard mask 3' is formed by means of structuring of the SiO$_2$ layer 3 (see FIG. 2).

The hard mask 3' includes quadratic massive elements that are arranged in the form of a grid having an edge length of, for example, 0.15 μm and a mutual spacing of, for example, 0.15 μm. Between the massive elements of the hard mask 3', the surface of the n$^+$-doped layer 5 is exposed. Through the grid-type arrangement of the massive elements of the hard mask 3', strip-type masking trenches run between adjacent massive elements. Accordingly, first masking trenches, which run perpendicular to the second plane parallel to the main surface 4, intersect second masking trenches that run parallel to the second surface outside the represented section.

Using the hard mask 3' as an etching mask, first partial trenches 6$_1$ and second partial trenches 6$_2$ are etched. The etching takes place, for example, with HBr, CL$_2$. The depth of the etching is, for example, 1.0 μm. The depth of the etching must be large enough that the first partial trenches 6$_1$ and the second partial trenches 6$_2$ extend into the p-doped substrate material 1 above the buried n$^+$-doped layer 2. In the etching of the first partial trenches 6$_1$ and the second partial trenches 6$_2$, the n$^+$-doped layer 5 is structured. Source/drain regions 5' selection transistors are thereby formed.

By means of implantation with arsenic or phosphorus with a dose of $5\times10^{15}$ cm$^{-2}$ and an energy of 50 keV, and subsequent tempering, a doped region 7 is formed on the floor of the first partial trenches 6$_1$ and of the second partial trenches 6$_2$ (see FIG. 4). Corresponding to the curve of the first partial trenches 6$_1$ and of the second partial trenches 6$_2$, the doped region 7 includes a grid-shaped cross-section parallel to the main surface 4. After diffusion out by means of subsequent high-temperature steps, the depth of the doped region 7 is, for example, approximately 0.1 μm. It is dimensioned in such a way that the doped region 7 does not extend up to the surface of the buried n$^+$-doped layer 2.

In order to avoid a doping of the exposed side walls of the first partial trenches 6$_1$ and of the second partial trenches 6$_2$, it is advantageous to mask (this is not shown) these side walls with approximately 20 nm of thin SiO$_2$ spacers, formed by deposition of a 20 nm-thick SiO$_2$ layer and anisotropic back-etching.

By means of anisotropic etching with Cl$_2$, HBr, using the hard mask 3' as an etching mask, first trenches 8 and second trenches (not visible in this section) are formed from the first partial trenches 6$_1$ and the second partial trenches 6$_2$. The first and second trenches extend from the main surface 4 up to the buried n$^+$-doped layer 2 (see FIG. 5). The depth of the first trenches 8 and of the second trenches is about 1.0 μm. Silicon columns 9 are thereby formed between the first trenches 8 and the second trenches 9 running transverse thereto (see FIG. 5). During the formation of the silicon columns 9, the doped grid-type area 7 is structured. Annular common source/drain regions 7' thereby arise at the edges of the silicon columns 9.

By means of thermal oxidation, a first gate oxide 10 is formed with a thickness of, for example, 5 nm (see FIG. 6). The first gate oxide 10 covers at least the edges of the silicon columns 9 between the common source/drain region 7' and the buried n$^+$-doped layer 2.

By deposition of a first conductive layer of in situ n$^+$-doped polysilicon in a layer thickness of, for example, 30 nm, and subsequent anisotropic back-etching with C$_2$F$_6$, first doped polysilicon spacers 11 are formed. The first doped polysilicon spacers 11 cover the lower region of the edges of the silicon columns 9. The first doped polysilicon spacers 11 extend at least up to the pn junction, facing the buried n$^+$-doped layer 2, of the common source/drain region 7' with the p-doped substrate material of the silicon column 9. The first doped polysilicon spacer 11 annularly surrounds the respective silicon column 9. It forms the gate electrode of a memory transistor that is formed from the part (adjacent to the respective silicon column 9) of the buried n$^+$-doped layer 2 as the source/drain region, from the common source/drain region 7' in the corresponding silicon column 9, and from the p-doped silicon arranged therebetween.

On the surface of the first doped polysilicon spacer 11, a dielectric layer is subsequently applied which is made of SiO$_2$, nitride SiO$_2$ or Si$_3$N$_4$, for example, in a layer thickness of approximately 0.5 to 1.5 μm. For clarity, the dielectric layer is not shown. On the dielectric layer, a second conductive layer, made of in situ n-doped polysilicon, for example, is deposited and anisotropically back-etched. By this means, a second doped polysilicon spacer 12 is formed (see FIG. 7). The second doped polysilicon spacer 12 annularly surrounds the first doped polysilicon spacer 11 and, together with the dielectric layer and the first doped polysilicon spacer 11, forms an integrated diode with an asymmetrical characteristic line. For this purpose, the concentration of doping material is set to approximately $10^{20}$ cm$^{-3}$ in the first doped polysilicon spacer 11 and to approximately $10^{17}$ cm$^{-3}$ in the second doped polysilicon spacer 12.

By means of deposition of flowable SiO$_2$, a first intermediate oxide layer 13 is formed which fills the lower region of the first trenches 8 and of the second trenches up to the height of the common source/drain region 7'. The first intermediate oxide layer 13 thereby leaves partly uncovered the surface of the second doped polysilicon spacer 12 (see FIG. 8). By means of an isotropic etching, for example, with HF, exposed parts of the first gate oxide 10 are removed. Subsequently, a metal that can be silicided, such as titanium or tungsten, is deposited and silicided. In this way, there arises on the surface of the second doped polysilicon spacer 12 a conductive structure 14 made of metal silicide that connects the second doped polysilicon spacer 12 with the common source/drain region 7' (see FIG. 9). By means of doping the second doped polysilicon spacers 12 of $10^{17}$ cm$^{-3}$ and the use of titanium silicide for the conductive structure 14, this structure, together with the second doped polysilicon spacer, forms a Schottky diode. Together with the diode formed from the first doped polysilicon spacer 11 and the second doped polysilicon spacer 12, this diode is used as a diode structure. Alternatively, the Schottky diode or the diode formed from the first doped polysilicon spacer 11 and the second doped polysilicon spacer 12 can be used alone, wherein the second doped polysilicon spacer 12 is of the p doping type.

Subsequently, a second intermediate oxide layer 15, which completely covers the conductive structure 14 (see FIG. 10), is formed by deposition of flowable oxide. By means of thermal oxidation, a second gate oxide 16 is formed on the exposed edges of the columns 9 in a layer thickness of, for example, 5 nm.

Thereafter, a conductive layer 17 made of in situ doped n⁺-doped polysilicon is deposited in a layer thickness of approximately 100 nm, (see FIG. 10). By means of back-etching and structuring of the conductive layer 17, wordline segments 17' are produced between adjacent silicon columns 9 (see top view in FIG. 11). The wordline segments 17' respectively form, with the silicon columns 9 adjacent thereto, parallel strip-type structures arranged at a distance from one another. Between adjacent strip-type structures, respectively formed from the wordline segments 17' and the associated silicon columns 9, the surface of the second intermediate oxide layer 15 is exposed.

By means of isotropic etching with HF, for example, exposed parts of the second gate oxide 16 are removed. A thermal oxidation is carried out in which a third gate oxide 18 is formed on exposed silicon surfaces. The third gate oxide 18 is formed in a thickness of, for example, 5 nm. Subsequently, a conductive layer made of in situ n⁺-doped polysilicon, for example, is deposited and structured by means of anisotropic back-etching. A third doped polysilicon spacer 19 is thereby formed that annularly surrounds the respective silicon column 9 (see FIG. 12). The third doped polysilicon spacer 19 forms a gate electrode for the readout transistor which is formed from the common source/drain region 7', the p-doped silicon of the silicon column 9 and the source/drain region 5'. The third doped polysilicon spacers are arranged on the surface of the wordline segments 17'.

A conductive connection with these is produced by removing, with an isotropic etching using HF, the third gate oxide 18 on the exposed surface of the wordline segments 17', and subsequently depositing an in situ doped polysilicon layer of approximately 30 nm thickness. With a spacer etching, fourth polysilicon spacers 20 are formed which conductively connect the wordline segments 17' with the third polysilicon spacers 19. Together with the wordline segments 17', the third doped polysilicon spacers 19 form the wordlines. The memory cell arrangement is completed in a known way by deposition of a further intermediate oxide, by means of contact hole etching for the connection of bitlines to the source/drain regions 5', and by means of the formation of bitlines, metallizations and passivation layers (not shown in detail).

In a further exemplary embodiment, the procedural sequence, as depicted with the aid of FIGS. 1 to 5, is carried out wherein the formation of the buried n⁺-doped layer 2 does not take place. After the procedural state reached in FIG. 5, an implantation with arsenic is carried out with, for example, a dose of $10^{15}$ cm$^{-2}$ and an energy of 30 keV so as to form a grid-type n⁺-doped region 2' on the floor of the first trench 8 and of the second trench (see FIG. 13, in which parts identical to those in the first exemplary embodiment are designated with the same reference characters). Adjacent webs of the grid-type n⁺-doped region 2' are dimensioned so that p-doped silicon of the substrate 1 is arranged between them.

The process steps as explained with the aid of FIGS. 6 and 7 are next carried out. After the formation of the second doped polysilicon spacers 12, a thermal oxidation is carried out for the formation of a thin SiO₂ layer on the surface of the second doped polysilicon spacers 12 (not shown). The SiO₂ layer has a thickness of approximately 5 nm. Subsequently, a conductive filling is formed by deposition of in situ doped polysilicon and by back-etching of the polysilicon. Such fills the floor of the first trenches 8 and second trenches and extends maximally up to the height of the second doped spacers 12. With the second doped polysilicon spacers 12, the conductive filling 13' forms an additional capacitance which increases the capacitance of the overall arrangement for the storing of the charge that represents the information. The conductive filling 13' can be contacted (not shown) and charged with a defined potential. The memory cell arrangement is subsequently completed as described with the aid of FIGS. 9 to 12.

Although the present invention has been described with reference to specific embodiments, those of skill in the art will recognize that changes may be made thereto without departing from the spirit and scope of the invention as set forth in the hereafter appended claims.

We claim as our invention:

1. A DRAM cell arrangement, comprising:
 a substrate; and
 a plurality of dynamic self-amplifying memory cells integrated in the substrate, wherein each of the memory cells further comprises:
 a selection MOS transistor having a source/drain region connected to a bit line and having a gate electrode connected to a word line;
 a memory MOS transistor connected to the selection MOS transistor via a common source/drain region, the memory MOS transistor and the selection MOS transistor positioned vertically one over the other and in relation to a main surface of the substrate, the memory MOS transistor having a source/drain region connected to a supply voltage line; and
 a diode structure connected between the common source/drain region and a gate electrode of the memory MOS transistor.

2. A DRAM cell arrangement as claimed in claim 1, further comprising:
 a plurality of substrate columns extending perpendicularly from the main surface of the substrate, each of the columns associated with one of the plurality of memory cells wherein the selection MOS transistor and memory MOS transistor are positioned on edges of the column and wherein the column is annularly surrounded by the diode structure, the gate electrode of the selection MOS transistor and the gate electrode of the memory MOS transistor.

3. A DRAM cell arrangement as claimed in claim 2, wherein:
 the supply voltage line is partially positioned within the substrate underneath a respective column;
 the word line includes a plurality of segments, each segment arranged between adjacent columns and connecting the gate electrode of the selection MOS transistors respectively positioned on the adjacent columns; and
 the diode structure is positioned underneath the word line.

4. A DRAM cell arrangement as claimed in claim 1, wherein the diode structure includes an np diode.

5. A DRAM cell arrangement as claimed in claim 1, wherein the diode structure includes a Schottky diode.

6. A DRAM cell arrangement as claimed in claim 1, wherein the diode structure includes a thin-layer diode.

7. A DRAM cell arrangement as claimed in claim 2, further comprising:
 an additional conductive structure positioned between adjacent columns wherein the conductive structure engages the diode structures respectively positioned on the adjacent columns to form an additional capacitance.

* * * * *